United States Patent [19]

Burnham et al.

[11] 4,033,796
[45] July 5, 1977

[54] METHOD OF MAKING BURIED-HETEROSTRUCTURE DIODE INJECTION LASER

[75] Inventors: Robert D. Burnham; Donald R. Scifres, both of Los Altos, Calif.

[73] Assignee: Xerox Corporation, Stamford, Conn.

[22] Filed: June 23, 1975

[21] Appl. No.: 589,277

[52] U.S. Cl. .............................. 148/175; 29/580; 148/171; 156/648; 331/94.5 H; 357/16; 357/18

[51] Int. Cl.² ................... H01L 21/20; H01L 21/74; H01S 3/06

[58] Field of Search .................. 148/171, 172, 175; 156/17, 612; 357/18, 16, 56; 331/94.5 H; 29/580

[56] References Cited

UNITED STATES PATENTS

| | | | |
|---|---|---|---|
| 3,436,625 | 4/1969 | Newman | 148/175 X |
| 3,465,159 | 9/1969 | Stern | 148/175 UX |
| 3,579,055 | 5/1971 | Ross | 357/18 |
| 3,764,409 | 10/1973 | Nomura et al. | 148/175 |
| 3,780,358 | 12/1973 | Thompson | 331/94.5 H |
| 3,783,351 | 1/1974 | Tsukada et al. | 357/18 |
| 3,824,493 | 7/1974 | Hakki | 331/94.5 H |
| 3,849,790 | 11/1974 | Gottsmann | 357/18 |
| 3,859,178 | 1/1975 | Logan et al. | 357/18 X |
| 3,865,646 | 2/1975 | Logan et al. | 148/171 |
| 3,893,044 | 7/1975 | Dumke et al. | 331/94.5 H |

OTHER PUBLICATIONS

Iida et al., "Morphological Studies on Selective Growth of GaAs" J. Crystal Growth 13/14, 1973, pp. 336-341.
Levenberger et al., "Complementary-MOS . . . Counter" Proc. IEEE, vol. 57, No. 9., Sept. 1969, pp. 1528-1532.
DeGelormo et al., "Fabrication of Injection Laser" IBM Tech. Discl. Bull., vol. 16, No. 7, Dec. 1973, p. 2156.
Doo, V. Y., "Junction Isolation . . . Regrowth Technique".
Ibid., vol. 8, No. 4, Sept. 1965, pp. 668-669.

Primary Examiner—L. Dewayne Rutledge
Assistant Examiner—W. G. Saba
Attorney, Agent, or Firm—M. J. Colitz; T. J. Anderson; L. Zalman

[57] ABSTRACT

A method of making a buried-heterostructure (BH) diode injection laser capable of operating at low room temperature thresholds and in the lowest order TE, TM, or TEM modes. Following formation of a pump current confining layer in a substrate, an elongated groove or channel is formed in the substrate with the groove extending through the pump current confining layer. A first light guiding and carrier confining layer, an active layer, and a second light guiding and carrier confining layer are then grown successively on the grooved surface of the substrate with the active layer material having both a higher index of refraction and lower bandgap than the material(s) of the light guiding and carrier confining layers. The central portion of the active layers is completely surrounded by the light guiding and carrier confining layers and, due to the preponderance of nucleation sites at the bottom of the groove, the central portion of the active layer has a cross-section that is bowl-shaped, that is, arched inwardly toward the main body of the substrate. Due to the shape of the central portion of the active layer and the lower index of refraction of the light guiding and carrier confining layers, light waves produced by carrier recombination when the diode is forwarded biased are guided in the central portion of the active layer to thereby make CW room temperature operation with lowest order transverse modes possible with an output beam having a substantially symmetrical cross-section. Low threshold currents are obtained because the filamentary region of the laser is completely surrounded by the light guiding and carrier confining layers, both of which have larger energy gaps than the active region.

20 Claims, 7 Drawing Figures

METHOD OF MAKING BURIED-HETEROSTRUCTURE DIODE INJECTION LASER

BACKGROUND OF THE INVENTION

In order to lower the threshold current density of a double heterojunction diode laser below the critical limit for CW operation, it is necessary to have the thickness of the active layer on the order of 0.5 microns or less. The usual cleaved and sawed double heterojunction lasers have cross-sectional areas which are typically on the order of 0.2 microns × 20 microns. To make the laser beam produced by heterojunction diode lasers compatible with optical systems utilizing round lenses, or other symmetric optical elements, it is desirable to reduce the large dimensional unbalance between active area width and thickness from the order of several hundred to one to as close to a one to one ratio as possible, with a five to one ratio being satisfactory.

Recently, a double heterojunction diode laser was disclosed in which the width of the filamentary area of the active layer was substantially reduced. The disclosed diode laser is called a buried-heterostructure (BH) injection laser since the filamentary active laser region is completely surrounded by a region of lower index of refraction material, that is, surrounded by GaAlAs when the active region is GaAs. The typical fabrication process for the disclosed BH laser is composed of four main steps: (i) a liquid phase epitaxial growth step to produce on a GaAs substrate a first GaAlAs layer, an active layer of GaAs, and a second GaAlAs layer, (ii) a mesa etching step which removes part of the two GaAlAs layers and part of the GaAs layer to define the active filamentary area, (iii) a second liquid phase epitaxial growth step to provide a GaAlAs layer around the mesa to thereby completely surround the active filamentary area with material having a lower index of refraction than that of the active filamentary area, that is, burying or surrounding the active filamentary area with GaAlAs when the active region material is GaAs, and, finally (iiii) a selective diffusion of a p-type dopent (zinc) to provide a p-type channel from the non-substrate end of the device to the GaAlAs layer adjacent the active filamentary area. The last step requires that an apertured masking layer be formed on the non-substrate end of the device with the aperture in precise alignment with the top of the mesa.

The described process has the readily apparent disadvantage of requiring two separate epitaxial growth steps. Another disadvantage is that several layers of varying composition and thickness must be etched, or otherwise removed, and these variances make the etching or removal difficult to control. A further disadvantage is that subsequent to the etching step and prior to the second epitaxial growth, the exposed surfaces of the mesa can get oxidized because of the problem of aluminum contamination with such contamination creating defects in the active filamentary area. Also, the second epitaxial growth can cause melt back of the regions formed by the first epitaxial growth with the likelihood of further defects in the active region.

As noted, the zinc diffusion of the described process to form a non-rectifying channel to the GaAlAs layer on the non-substrate end of the active filamentary area, must be through a masking aperture which is precisely aligned with the mesa top. Such alignment is difficult to maintain because the top of the mesa is hidden by the second epitaxial growth layers and because tolerances of better than a micron must be maintained. In further reference to the zinc diffusion, the diffused region must extend through a relatively thick (5 micron) GaAlAs layer and terminate in a relatively thin (1 micron) GaAlAs layer. If the diffusion is not deep enough a rectifying barrier will be created that will prevent pumpcurrent flow and if the diffusion is too deep the active region (0.5 microns thick) could be penetrated. The zinc diffusion is hard to control due to the different thicknesses between layers, as discussed, and also due to the varying thickness of each layer. Thus, the zinc diffusion must be controlled extremely accurately. Another difficulty with the mesa producing process is that the mesa is a very long, thin plateau which is easily disturbed, that is, chipped or broken off during the subsequent epitaxial growth and zinc diffusion steps.

OBJECTS OF THE INVENTION

It is an object of the invention to provide an improved method of making a buried-heterojunction diode laser.

It is a further object of the present invention to provide an improved method of making a double heterojunction diode laser that requires few process steps.

It is a further object of the present invention to provide an improved method of making a buried-heterojunction diode laser that requires only one epitaxial growth.

It is a still further object of the present invention to provide an improved method of making a buried-heterojunction diode laser wherein diffusion is easily controlled.

SUMMARY OF THE INVENTION

A buried-heterojunction (BH) diode laser is provided which is capable of operating at room temperature thresholds and at the lowest order TE, TM, or TEM mode. The BH diode laser is characterized by an active region which is completely surrounded (buried) by material of lower index of refraction and higher band gap. The filamentary area of the active region is substantially bowl-shaped, that is, thicker in the middle than at the ends and is substantially completely within an elongated channel of the laser substrate. This filamentary area configuration and placement is effective to favor emitted light in the central portion of the active region which permits the width of the light beam produced to be small (1-2$\mu$) and thus, provides a laser having a fairly symmetrical light output beam with lowest order transverse modes in both directions and threshold currents as low as 10 milliamps.

The BH diode laser is made by a process in which the filamentary area of the active layer is formed substantially within a groove etched in the diode substrate. First, a p-type surface layer is provided in the n-type substrate to provide, subsequently, a current blocking junction. Next, an elongated groove is etched in the substrate to a depth deeper than the surface layer thickness. Following formation of the groove, a layer of a light guiding and carrier confining material, a layer of active region material and a second layer of light guiding and carrier confining material are grown successively on the grooved surface of the substrate by conventional liquid phase epitaxial growth or molecular beam epitaxy, with the active region being doped such that it forms a rectifying junction with one of the light guiding layers. Due to the shape of the groove, nucleation sites for the first growth layer are more prevalent near the bottom extremities of the groove than at other portions of the groove and thus the first growth layer has a depressed central area which is filled in by the growth of the active material layer to provide an active region having a bowl-shaped filamentary area.

DESCRIPTION OF THE PREFERRED EMBODIMENT

Figure 1:
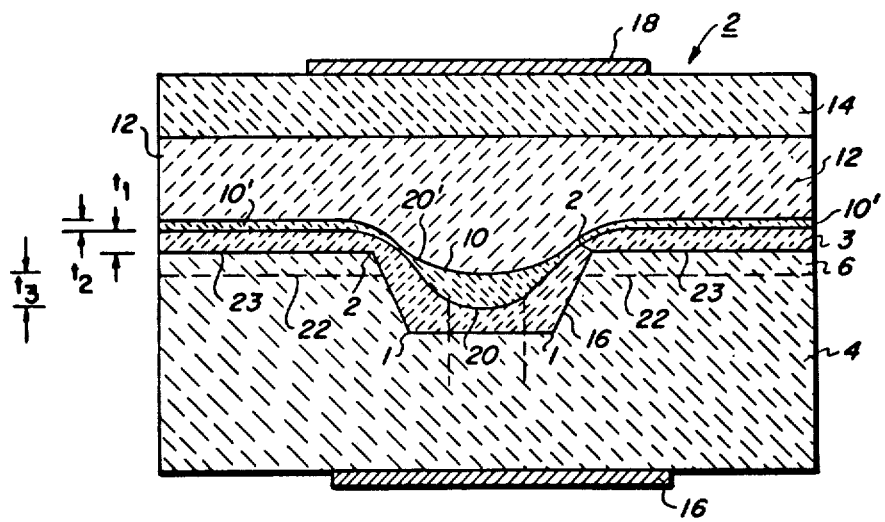
FIG. 1 is an end view of a BH laser in accordance with the invention.

Referring now to FIG. 1, there is shown an end view of a BH diode laser 2 in accordance with the invention. Laser 2 includes a substrate 4, a diffused layer 6, a first light wave guiding and carrier confining layer 8, an active material layer having central portion 10 and end portions 10', a second light wave guiding and carrier confining layer 12, and a contact-facilitating layer 14. The central portion of the layer 8 and the central portion 10 of the active material layer are within a groove 16 formed in the substrate 4 and extending through the diffused layer 6. Groove 16 is defined by lower extremities 1 and upper extremities 2.

Layer 8 and active material layer 10'-10-10' are of different conductivity type to provide a rectifying junction 20 therebetween. Contacts 16 and 18 are provided in contact with substrate 4 and layer 14, respectively, to provide means for forward biasing rectifying junction 20 at the interface of layer 8 and active material layer 10'-10-10'. Layers 4 and 8 are of different conductivity type than layer 6 such that second and third rectifying junctions 22 and 23 exist at the interface between layers 4 and 6 and 6 and 8, respectively. When junction 20 is forward biased, junction 22 is also forward biased and junction 23 is back biased. More specifically, substrate 4 can be n-type GaAs, layer 6 can be p-type GaAs, light wave guiding and carrier confining layer 8 can be n-type GaAlAs, active layer 10'-10-10' can be p-type GaAs, light wave guiding and carrier confining layer 12 can be p-type GaAlAs, and contact-facilitating layer 14 can be p-type GaAs. Layer 10'-10-10' can be n-type GaAs in which case a rectifying junction 20' would exist between the layer of active material 10'-10-10' and layer 12, and layer 10'-10-10' can be undoped to provide a rectifying junction somewhere intermediate layers 8 and 12 12.

As discussed in detail hereinafter, the bowl-shape of the central portion 10 of the active material layer is controlled, in part, by the shape of the first light wave guiding and carrier confining layer 8 which has a central trough or elongated depression 8' which results from the groove 16 and the tendancy for nucleating atoms to attach themselves more readily at places that require less energy for bonding, which, in fact, are those places which have the highest density of neighboring atoms. From FIG. 1, it can be seen that the groove angles at lower extremities 1 are about 125° whereas the groove angles at upper extremities 2 are about 235°. Thus, there is a higher density of neighboring atoms at lower extremities 1 than at upper extremities and hence nucleation and incorporation of growth material into the substrate lattice can occur more easily at lower extremities 1 than at upper extremities 2. Other nucleation control factors will be discussed when the method of making the diode 2 is described.

Figure 2:
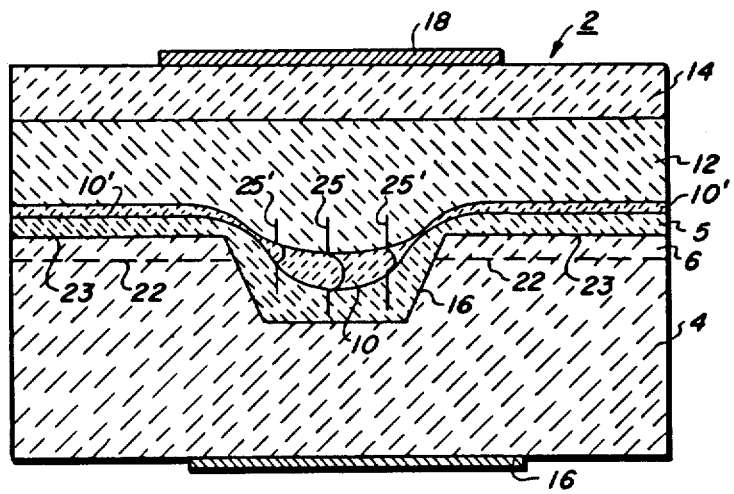
FIG. 2 is a symbolic representation of light wave energy distribution in the laser of FIG. 1.

As noted, the central portion 1 of the active material layer has a bowl-shaped cross-section, being deeper in the central region and very shallow adjacent the upper extremities 2. Since the light beam rays generated as a result of the recombination of carriers when junction 20 is forward biased are guided by material having a high index of refraction than adjacent layers 8 and 12, the filamentary area of the laser, defined symbolically as existing between lines 10a and 10b, is confined to the central portion 10 of the active material layer. Referring to FIG. 2, the emitted light energy distribution pattern is illustrated symbolically by light energy distribution patterns 25 and 25' for the center and ends, respectively, of the bowl-shaped, central portion 10 of the active material layer. A majority of the laser light emitted is concentrated in the middle of central portion 10, that is, within the filamentary area defined by lines 10a and 10b. Since the filamentary area has a maximum depth on the order of 1 micron and a width of about 1–2 microns, the laser output beam produced by laser 2 has an approximately round shape which makes it compatible with external round lenses thereby eliminating the need for complicated lens arrangement which are required with lasers having a mesa structure, as previously described.

Figure 3A:
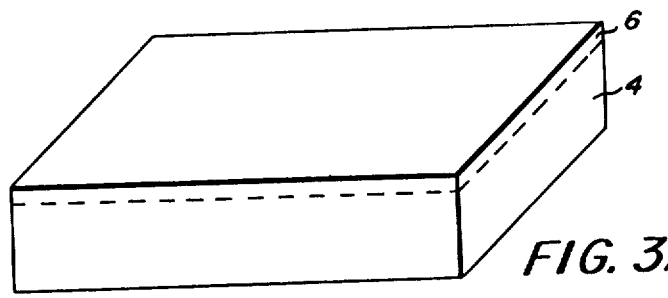
FIG. 3A–3E shows various process steps in the production of the laser of FIG. 1.
Figure 3B:
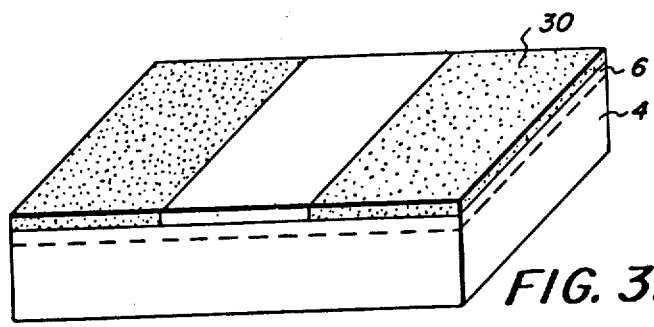
Figure 3C:
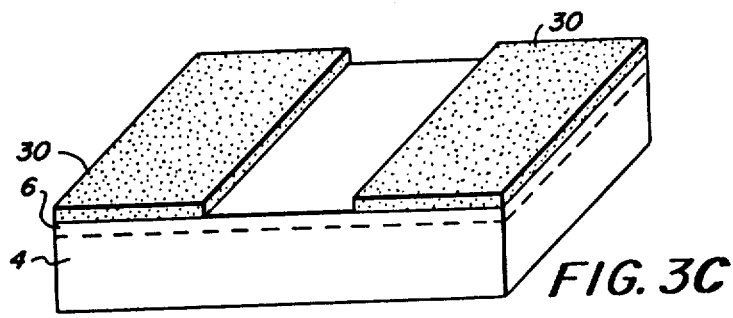

The laser 2 of FIG. 1 is made by a process which requires only a single epitaxial growth step, which can be a liquid phase epitaxial growth or a molecular beam epitaxial growth. The process is initiated by placing in a diffusion ampoule the substrate 4 which as previously noted can be n-type GaAs and a p-type dopent, such as zinc, and diffusing the dopent into the substrate 4 to form p-type region 6, as shown in FIG. 3A. Substrate 4 preferably has a dopent level of $1-5 \times 10^{18}/cm^3$ and a layer 6 preferably has a doping level slightly greater than the doping level of substrate 4. Next a layer of a conventional photoresist, such as the ultraviolet sensitive photoresist Shipley AZ 1350 is deposited over the layer 6 followed by exposure of the resist, as shown in FIG. 3B, wherein the dotted portions of resist layer 30 has been exposed to make those portions insensitive to a reagent, such as Shipley developer when the photoresist is Shipley AZ 1350. The unexposed portion of the photoresist, which can be 1–2 microns in width or still smaller, is then removed such as by immersion of the substrate wafer of FIG. 3B in a bath of a suitable photoresist developer reagent to provide the structure of FIG. 3C. A groove or channel 16 is then formed in the substrate 4 in the area not protected by resist 30 to provide the substrate wafer configuration of FIG. 3D. The depth of groove 16 is not critical but it is necessary that the groove 16 extend through the layer 6 in the substrate 4. For example, layer 6 can be 0.6 microns thick in which case groove 16 would be about 1.5 microns deep. The depth of layer 6 is not critical and the depth of groove 16 is also not critical, for example, layer 6 can have a thickness range from 0.1 to 2 microns or more and groove 16 can be 0.2 to 2.5 microns or more deep, provided that groove 16 extends through layer 6 in substrate 4. Groove 16 can be formed by conventional chemical etching, ion milling or a combination of these techniques or other known techniques for removing the substrate material. When the substrate material is as previously specifically specified, that is, GaAs, an etch bath composed of 20 parts ethylene glycol, five parts phosphoric acid, and one part hydrogen peroxide is satisfactory, with the etch bath maintained at room temperature and with the etch bath being stirred during the etching process.

Figure 3D:
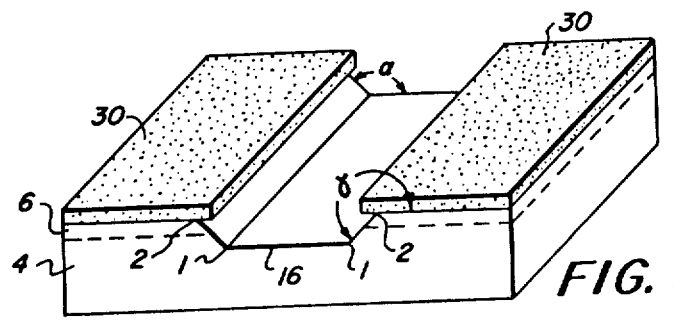

Since p-type material (the material of layer 6) etches faster than n-type material (the material of substrate 4), the etched groove 16 takes on the sloping sidewall configuration of FIG. 3D with the sloping walls having a (111) A or GaAs plane atomic surface and the top surface of substrate 4 having a (100) crystallographic orientation. The upper width of the groove 16 is controlled by the opening in the resist 30, and due to undercutting of the resist 30 by the etch bath, the upper width of groove 16 can be slightly wider than the opening of resist 30. The width of the bottom of the groove 16 will depend greatly upon groove depth but is generally on the order of the width of the opening in the resist 30. It is noted again that the angle $\alpha$ formed between each of the sidewalls and the bottom of the groove 16, that is, at lower extremities 1 is less than 180° whereas the angle $\gamma$ formed between the sidewalls and the top of the layer 6, that is, at the upper extremities 2 is greater than 180°. These angles are important for nucleation site purposes.

Figure 3E:
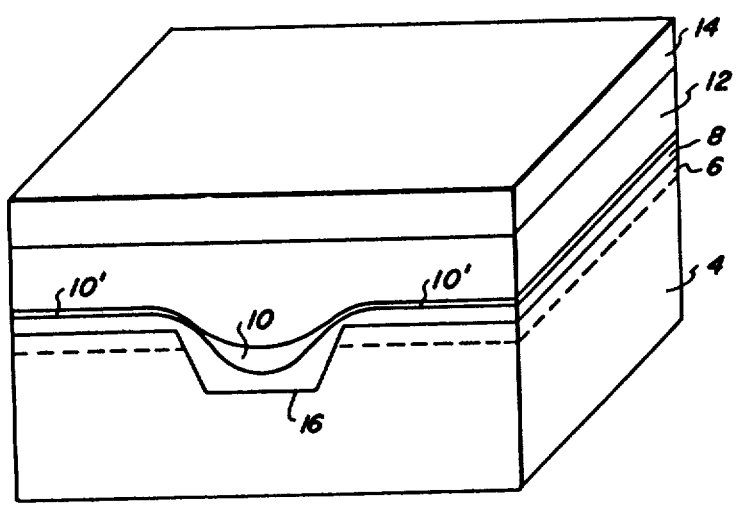

Following formation of groove 16, the remaining photoresist 30 is removed from the substrate after configuration of 3D and the layers 10'-10-10', 12 and 14 are grown consecutively by means of conventional liquid phase epitaxial growth to produce the device of FIG. 3E. Other methods of layer growth could also be used such as molecular beam epitaxy. The layer 8 has a depressed region in channel 16 due, in part, to the prevalence of nucleation sites at extremities 1 which cause a greater growth rate at those extremities. Layer 8 could have a thickness $t_1$ adjacent to layer 6 of about 1 micron, although it could have a thickness range of 0.5 to several microns. It is important, however, that the growth of layer 8 be terminated before the depressed central area is smoothed over. The portions 10' of the active material layers are substantially planar with a width $t_2$ of about 0.2 microns (although a range of $t_2$ from 0.1 to 1 micron or more is acceptable) and the central portion 10 of the active material layer is bowl-shaped and within the groove 16. When thickness $t_2$ is 0.2 microns, the thickness $t_3$ of the bowl-shaped central portion 10 would be about 0.4–0.8 microns. Once again, the configuration of the bowl-shaped central portion 10 of the active material layer is controlled by nucleation sites on layer 8 with such sites being greater in the depressed central area of layer 8. Actually, the reasons layers 8 and 10'-10-10' grow as they do is dependent upon other factors besides nucleation sites. Some of these factors, which are well known to those versed in the semiconductor fabrication art, are depth of groove 16, width of groove 16, depth of diffusion of layer 6, crystallographic orientation of substrate 4, growth times, growth temperatures, cooling rates, degree of clean wiping melts, and whether the melts are saturated or super saturated. The growth of the active material layer 10'-10-10' can be continued until the entire top surface is substantially smooth, however, this additional growth will substantially increase the width of the active material that will provide guiding of the light beam produced by carrier recombination, that is, increase the width of the filamentary area, and thus the width of the output laser beam will be substantially greater than the height of the output laser beam thereby making symmetric optical elements uncompatible.

The GaAlAs layer 12 is typically 1.5 microns thick although the thickness range may be from 1 to 3 microns or more. Layer 14 is typically 1–4 microns thick and substrate 4 is typically 100 microns thick. The concentration of aluminum in layers 8 and 12 is typically 0.4, although a range from 0.15 to 0.7 is acceptable. The doping levels of layers 10, 12 and 14 are typically $10^{16} - 10^{17}$ /cm$^3$, $10^{17}–10^{18}$/cm$^3$, and $10^{17}–10^{19}$/cm$^3$, respectively. The process is completed by applying electrodes 16 and 18 in a conventional manner. The method is also directly applicable to the fabrication of optical waveguides, modulators, directional couplers and other integrated optical components.

In operation, when the diode 2 is forward biased, that is, by applying a voltage to electrode 18 of approximately 1.4 volts greater than the potential applied to electrode 16, the junction 20 (or the junction 20' when the active material is n-type) is forward biased and electrons are injected from the central portion of layer 8 into the bowl-shaped central portion 10 of the active layer and are confined there by the surrounding heterojunction layers 8 and 12. With sufficient pump current, population inversion is achieved and gain is obtained with light produced by radiative recombination of the carriers in layer 10. This light is guided by layers 8 and 12 due to the lower index of refraction of these layers relative to that of layer 10.

Pump current flow is restricted to a path through channel 16 due to the back bias on junction 23 when the junction 20 is forward biased. This pump current path confinement could be achieved by other than diffusion techniques. For example, substrate 4 can be provided with an intrinsic layer instead of layer 6, or proton implantation could be used to create insulating regions in place of layer 6. Also, by selective growth, layer 6 could be grown instead of diffused.

The laser disclosed is capable of operating at low room temperature thresholds (approximately 10 milliamps) and operating in the lowest order TE, TM or TEM modes. What makes this operation possible is that the central portion 10 of the active layer is completely or almost completely surrounded (buried) in the groove 16 by layers 8 and 10 of lower index of refraction material. The pump current is substantially restricted to a flow path through the central portion 10 of the active layer within the groove 16 because regions 6 provide p-n junctions 23 which are back biased when diode laser is forward biased for pumping mainly the "buried" portion of the active region of the diode laser. The major advantage of this structure is that most of the carriers for radiation recombination are injected into the buried, bowl-shaped region 10 of the active layer and substantially all of the light waves produced can be confined to the bowl-shaped region 10 of the active layer, and more particularly to the filamentary area of the active layer because the effective index of refraction of the active layer decreases as the active layer thickness decreases. Thus, the light waves produced tend to be focused in the center of the buried active layer because that is where the active layer is thickest and thus has the highest index of refraction. Accordingly, by controlling active region geometry, it is possible to provide CW room temperature lasers with lowest order transverse modes in both directions and threshold currents as low as 10 milliamps.

What is claimed is:

1. A method of making a heterojunction diode laser comprising the steps of:

forming in a semiconductor single crystal material substrate of one conductivity type a surface layer of the second conductivity type to form a current blocking p-n junction when a bias is applied to the heterojunction hereinafter formed, removing both a portion of said surface layer and an additional part of said substrate material adjacent thereto to provide an elongated groove in said substrate, said groove dividing said surface layer into distinct parts, forming on the entire surface of said grooved surface of said substrate a first single crystal epitaxial layer of semiconductor material of said one conductivity type, with formation of said first layer being concluded while the portion of the exposed surface of said first layer in said groove is concave, forming on said first layer a second layer of a semiconductor material of higher index of refraction than that of said material of said first layer of either conductivity type, with formation of said second layer being concluded when the exposed surface of said second layer directly over the concave surface of said first layer is substantially flat to form a current carrying p-n junction when said junction in the groove is forward biased and the conductivity of said second layer is of a second conductivity type, forming on said second layer a third layer of semiconductor material of lower index of refraction that that of said second layer and of a second conductivity type than that of said first layer to form a p-n junction when said second layer is of a conductivity type which is the same as said first layer, and providing means for applying a bias voltage across the p-n junction formed in the groove such that the junction is forward biased when said bias voltage is applied and said rectifying junctions between said distinct parts of said surface layer and said first layer are reverse biased when said bias voltage is applied.

2. The method of claim 1 wherein said surface layer is formed by diffusion of material of said second conductivity type, and said first, second and third layers are formed by epitaxial growth.

3. The method of claim 1 wherein said groove is formed by providing a photoresist over selected portions of said surface layer of said substrate and then immersing said substrate in an etchant.

4. The method as defined in claim 1 wherein said second layer is GaAs and said first and third layers are GaAlAs.

5. The method as defined in claim 1 wherein said first and third layers are of the same material.

6. The method as defined in claim 5 wherein said first layer is n-type and said second and third layers are p-type such that said p-n junction exists between said first and second layers.

7. The method of making a heterojunction diode laser comprising the steps of:

forming in a semiconductor single crystal material substrate of one conductivity type a non-electrically conducting surface layer, removing both a portion of said surface layer and an additional part of said substrate adjacent thereto to provide an elongated groove in said substrate, said groove dividing said surface layer into distinct parts, forming on the entire surface of said grooved surface of said substrate a first single crystal epitaxial layer of semiconductor material of said one conductivity type, with formation of said first layer being concluded while the portion of the exposed surface of said first layer in said groove is concave, forming on said first layer a second layer of a semiconductor material of higher index of refraction than that of said material of said first layer of either conductivity type, with formation of said second layer being concluded when the exposed surface of said second layer within said groove is substantially flat said first and second layers providing a current carrying p-n junction when said junction in the groove is forward biased and the conductivity of said second layer is of a second conductivity type, forming on said second layer a third layer of a semiconductor material of lower index of refraction than that of said second layer and of a second conductivity type than that of said first layer to form a p-n junction when said second layer is of a conductivity type which is the same as said first layer, and providing means for applying a bias voltage across the p-n junction formed in the groove to thereby cause light to be generated in said second layer, with said light being guided by said first and third layers.

8. The method of claim 7 wherein said first, second and third layers are formed by epitaxial growth.

9. The method of claim 7 wherein said groove is formed by providing a photoresist over selected portions of said surface layer of said substrate and then immersing said substrate in an etchant.

10. The method as defined in claim 7 wherein said second layer is GaAs and said first and third layers are GaAlAs.

11. The method as defined in claim 7 wherein said first and third layers are of the same material.

12. The method as defined in claim 11 wherein said first layer is n-type and said second and third layers are p-type such that said p-n junction exists between said first and second layers.

13. A method of making a heterojunction diode laser comprising the steps of:

forming in a semiconductor single crystal material substrate of one conductivity type a surface layer of a second conductivity type to form a current blocking p-n junction between said surface layer and a first formed layer residing on said surface layer when a forward bias is applied to the heterojunction hereinafter formed, removing both a portion of said surface layer and an additional part of said substrate material adjacent thereto to provide an elongated groove in said substrate, said groove dividing said surface layer into distinct parts, forming on the entire surface of said grooved surface of said substrate a first single crystal epitaxial layer of semiconductor material of said one conductivity type, with formation of said first layer being concluded while the portion of said exposed surface of said first layer in said groove is concave toward said substrate, said first layer forming secondary current blocking junctions with each of said distinct parts of said surface layer when a forward bias is applied to the heterojunction hereinafter formed, forming on said first layer a second layer of a material of higher index of refraction than that of said material of said first layer of either conductivity type, with formation of said second layer being concluded when the exposed surface of said second layer within said groove is substantially flat said first and second layers thus providing a current carrying p-n junction when said junction in the groove is forward biased and the conductivity of said second layer is of a second conductivity type, forming on said second layer a third layer of a semiconductor material of lower index of refraction than that of said second layer, and of a second conductivity type than that of said first layer, at least one of said second and third layers being of the opposite conductivity type than that of said first layer such that a primary rectifying junction exists between these layers, and providing means for applying a biased voltage across the p-n junction formed in the groove such that said primary rectifying junction is forward biased when said biased voltage is applied and said secondary rectifying junctions are reversed biased when said biased voltage is applied.

14. The method as defined in claim 13 wherein said second layer in GaAs and said first and third layers are GaAlAs.

15. The method as defined in claim 13 wherein said first and third layers are of the same material.

16. The method as defined in claim 15 wherein said first layer is n-type and said second and third layers are p-type such that said p-n junction exists between said first and second layers.

17. A method of making a heterojunction diode laser comprising the steps of:

forming in a semiconductor single crystal substrate of one conductivity type a diffused surface layer of a second conductivity type to form a current blocking p-n junction between said surface layer and a first formed layer residing on said surface layer when a forward bias is applied to the heterojunction hereinafter formed, removing both a portion of said surface layer and an additional part of said substrate material adjacent thereto to provide an elongated groove in said substrate, said groove dividing said surface layer into two distinct parts, forming on the entire surface of said grooved surface of said substrate a first single crystal epitaxial layer of semiconductor material of said one conductivity type, with formation of said first layer being concluded while the portion of the exposed surface of said first layer in said groove is concave toward said substrate, forming on said first layer a second layer of a semiconductor material of higher index of refraction than that of said material of said first layer of either conductivity type, with formation of said second layer being concluded when the exposed surface of said second layer directly over the concave surface of said first layer is substantially flat to form a current carrying p-n junction when said junction in the groove is forward biased and the conductivity of said second layer is of a second conductivity type, forming on said second layer a third layer of a semiconductor material of lower index of refraction than that of said second layer and of a second conductivity type than that of said first layer to form a p-n junction when said second layer is of a conductivity type which is the same as said first layer, forming on said third layer a fourth layer of a semiconductor material of said second conductivity type, and providing means for applying a bias voltage across said fourth layer and said substrate such that the primary rectifying junction is forward biased when said biased voltage is applied.

18. The method as defined in claim 17 wherein said second layer is GaAs and said first and third layers are GaAlAs.

19. The method as defined in claim 17 wherein said first and third layers are of the same material.

20. The method as defined in claim 19 wherein said first layer is n-type and said second and third layers are p-type such that said p-n junction exists between said first and second layers.

* * * * *